United States Patent [19]

Maeda et al.

[11] Patent Number: 4,702,936
[45] Date of Patent: Oct. 27, 1987

[54] GAS-PHASE GROWTH PROCESS

[75] Inventors: Kazuo Maeda; Noboru Tokumasu; Toshihiko Fukuyama, all of Tokyo, Japan

[73] Assignee: Applied Materials Japan, Inc., Tokyo, Japan

[21] Appl. No.: 778,004

[22] Filed: Sep. 20, 1985

[30] Foreign Application Priority Data

Sep. 20, 1984 [JP] Japan ................................ 59-197100
Sep. 25, 1984 [JP] Japan ................................ 59-200244
Oct. 26, 1984 [JP] Japan ................................ 59-226231
Oct. 26, 1984 [JP] Japan ................................ 59-226232

[51] Int. Cl.$^4$ ............................................ B05D 3/06
[52] U.S. Cl. ..................................... 427/54.1; 437/241
[58] Field of Search ..................... 427/53.1, 54.1, 82, 427/93, 94

[56] References Cited

U.S. PATENT DOCUMENTS 3,200,018  8/1965  Grossman ............................. 427/82
4,265,932  5/1981  Peters et al. ........................ 427/53.1
4,495,218  1/1985  Azuma et al. ........................ 427/54.1
4,543,271  9/1985  Peters ................................ 427/54.1

Primary Examiner—John H. Newsome
Attorney, Agent, or Firm—Birch, Stewart, Kolasch & Birch

[57] ABSTRACT

A gas-phase growth process for forming a film of $SiO_2$, $Si_3N_4$ or $Si_xO_yN_z$, which comprises reacting a mixture of an organic or inorganic silane with one or more reaction gases comprising $O_2$, $N_2O$, $NO_2$, $NO$, $CO_2$, $CO$ and $NH_3$, with the proviso that the mixture of inorganic silane and $O_2$ is excluded as a reaction gas combination of the present invention. The process comprises feeding a reaction gas into a reaction chamber which is kept at a reaction temperature below 500° C., and subjecting the surface of a substrate chamber which is placed in the reaction chamber to UV irradiation. This irradiation excites the reaction gas, which allows a low-temperature gas-phase growth to proceed. The photo-excitation occurs selectively only at UV-irradiated sections, so that a film growth may occur selectively on the substrate surface within the range of UV irradiation. The optional use of a suitable mask allows a film of a prescribed pattern to be formed on the substrate surface.

6 Claims, 2 Drawing Figures

GAS-PHASE GROWTH PROCESS

FIELD OF THE INVENTION AND RELATED ART STATEMENT

The CVD (Chemical Vapor Deposition) method is widely used for the formation of protective film on wiring-applied devices.

In the process of forming such protective films, the reaction temperature is required to be as low as possible (ca. 400° C.) in order to protect aluminum wirings, etc. from being too highly heated.

Coventionally, high-quality films of $SiO_2$, PSG, etc. have been obtainable at a temperature as low as 400° C. only by using either the $SiH_4$—$O_2$ system or the plasma CVD method.

However, the technique of using the $SiH_4$—$O_2$ system has various problems, such as particle generation and low step coverage (uniform covering performance), since it utilizes gas-phase pyrolysis which will cause particles to grow in the gas phase until they are deposited onto the growing films.

On the other hand, the technique of using the plasma CVD method is at present not widely used since it has created some problems, such as radiation damage and low step coverage.

The systems now available for the preparation of films of $SiO_2$, $Si_3N_4$, $Si_xO_yN_z$, etc., are systems such as organic silane-$O_2$, —$N_xO_y$, —$CO_x$, and —$NH_3$.

However, these reaction-gas systems have such high activation energies that they would require a minimum reaction temperature to be as high as 600° C. Thus, they are applicable only to such uses as a diffusion mask where the use of high-temperature reaction conditions would have no effect. However, due to the use of such high temperatures being required, such systems would be inapplicable for use in the above-mentioned formation of insulating protective films.

As to the aforementioned CVD method which is widely used for the formation of insulating protective films on wiring-applied devices, this method would be advantageous if we allowed the insulating protective films to grow on the surface of substrates in prescribed patterns.

Conventionally, $SiO_2$ films are first made to grow over the entire surface of a substrate and then the films are subjected to chemical etching, etc., for pattern formation. However, such a treatment results in a low job efficiency, an increased the number of jobs, and a high manufacturing cost.

OBJECT AND SUMMARY OF THE INVENTION

The present invention has been developed as a result of efforts to eliminate the above-mentioned problems. The object of the present invention is to offer a novel gas-phase growth method which utilizes photo-excitation by UV irradiation in order to allow a reacting gas to initiate a reaction at low temperatures and which is capable of suppressing particle generations and forming uniform-thickness films which are free of pinholes.

Another object of the present invention is to offer a novel gas-phase growth method which is capable of allowing films to grow on substrates in prescribed patterns.

DETAILED DESCRIPTION OF PREFERRED EMBODIMENTS

Organic silane systems have been inapplicable to low-temperature CVD since they require higher temperatures than 700° C. for their decomposition or oxidation.

The present inventors have found that UV irradiation is capable of exciting reaction gases of the organic silane-$O_2$ system to such an extent that the oxidation of an organic silane may proceed at low temperatures. This acceleration of the oxidation is considered to be due to the conversion of part of the $O_2$ into $O_3$ or O.

UV irradiation is also capable of exciting the reaction systems of organic silane—$N_2O$, —$NO_2$, —NO, —$CO_2$, —CO, and —$NH_3$ so as to produce O. or N., which radicals in turn accelerate low-temperature oxidation.

UV irradiation is also capable of exciting the reaction systems of inorganic silane-$N_2O$, —$NO_2$, —NO, —$CO_2$, —CO, and —$NH_3$ so as to produce O. or N., which radicals in turn accelerate low-temperature oxidation.

An experiment has shown that the above-specified reactions mainly proceed on the surface of substrates. Consequently, even if the substrate has a ragged surface, a uniform film is allowed to grow irrespective of the presence of dented and projected sections so as to have an excellent step coverage. The surface reaction of the present invention is superior to the conventional pyrolytic process since the phenomenon of particle generation is inevitable in the pyrolytic process; particle generation will result from the sequence that particles increasing in size in the gas phase or adhering on the wall of reaction chamber are caused deposit onto the film growing on the substrate. The surface reaction of the present invention is also superior in that the film produced has a high density and few pinholes. Thus, films with an ideal surface condition may be obtained by the surface reaction of the present invention.

In addition, the UV irradiation method is capable of allowing films to grow selectively on the surface of a substrate since it is only the UV-irradiated sections that are subject to photo-excitation.

Accordingly, the use of a mask allow films of a prescribed pattern to be formed on the surface of a substrate. Thus, the UV irradiation method is very useful in that it would eliminate job steps, such as applying chemical etching to insulating a $SiO_2$ film.

It should be noted that organic silane (tetraethoxysilane) is liquid at ordinary temperatures and is safe to handle.

Figure 1:
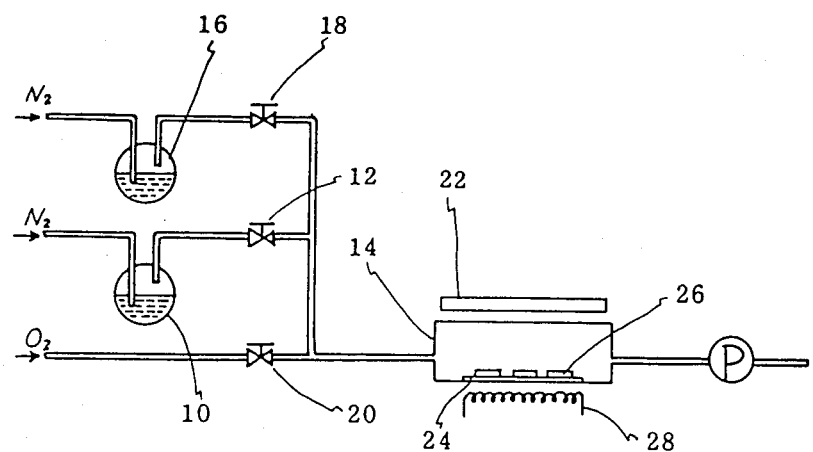
FIG. 1 is a schematic view illustrating the outline of a reaction system.

FIG. 1 illustrates the outline of a reaction system designed for using an organic silane, $O_2$, and an organic phosphorus as reaction gases.

An organic silane is accommodated in quartz bubbler 10, vaporized by $N_2$ gas as a carrier gas, and introduced into reaction chamber 14 via flow control valve 12.

An organic phosphorus is accommodated in a quartz bubbler 16, vaporized therein, and introduced by $N_2$ gas as a carrier gas into the reaction chamber via a flow control valve 18. An organic phosphorus may be replaced by inorganic phosphorus ($PH_3$). No phosphorus-system gases are, necessary when a SiO$_2$ film is to be obtained.

O$_2$ gas is introduced into reaction chamber 14 via flow control valve 20.

An HG lamp is provided outside reaction chamber 14 and irradiates the surface of wafer 26 placed on susceptor 24.

Heater 28 heats susceptor 24 so that wafer 26 on susceptor 24 is heated to ca. 400° C.

In operating the reaction system, each reaction gas is first introduced into reaction chamber 14 via each flow control valve and then the surface of wafer 26 is subjected to UV irradiation by Hg lamp 22. The UV irradiation will convert part of O$_2$ gas into O$_3$, which in turn will display its strong oxidizing ability to oxidize the organic silane below 400° C. Thus, the prescribed films are obtained.

Figure 2:
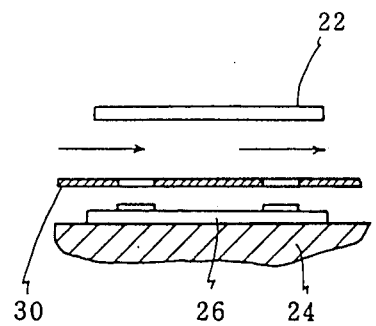
FIG. 2 is a schematic view illustrating the use of mask for allowing a film to grow on a wafer.

FIG. 2 illustrates use of a mask. Mask 30 is positioned at a short distance from the surface of wafer 26. Thus, a film is allowed to form on wafer 26 in accordance with the pattern previously formed on mask 30. The material for mask 30 should be transparent to UV e.g., quartz glass. The sections opaque to UV may be formed, for example, by chromium deposition; the sections transparent to UV correspond to the pattern for the film formation. The UV light passing through the UV-transparent sections will convert part of the O$_2$ gas into O$_3$, which in turn induces a surface reaction which would allow the film growth to proceed according to the pattern of mask 30.

Preferred embodiment examples are illustrated below.

EXAMPLE 1

Into a reaction chamber were introduced tetraethoxysilane vapor (80° C.) at 600 cc/min, O$_2$ gas at 600 cc/min, and N$_2$ gas as a carrier gas at 0.8 l/min. The surface of a wafer was irradiated from outside the reaction chamber by an Hg lamp (wavelengths 184.9 and 254.0 nm) to allow reaction to proceed at 400° C. The reaction resulted in a formation of SiO$_2$ film at a rate of 1000 Å/min.

No particle generation was observed and the step coverage was found to be good.

In another run a mask was placed at a short distance from the wafer surface and UV light was allowed to irradiate through the mask. A film was found to form on the wafer selectively in accord with the mask pattern.

EXAMPLE 2

In addition to the reaction conditions of Example 1, an organic phosphorus was introduced into the reaction chamber at a flow rate of 200 cc/min. A PSG film was formed at the rate of 1000 Å/min.

No particle generation was observed and the step coverage was found to be good. An additional use of a mask was found capable of similar selective growth of films on the wafer.

EXAMPLE 3

Into a reaction chamber were introduced tetraethoxysilane vapor (80° C.) at 170 cc/min, N$_2$O at 600 cc/min, and N$_2$ gas as a carrier gas at 1500 cc/min. The surface of a wafer was irradiated from outside the reaction chamber by a Hg lamp (wavelengths 184.9 and 254.0 nm) to allow reaction to proceed at 400° C. The reaction resulted in a formation of SiO$_2$ film at a rate of 1000 Å/min.

No particle generation was observed and the step coverage was found to be good. An additional use of a mask was found capable of similar selective growth of films on the wafer.

EXAMPLE 4

Into a reaction chamber were introduced tetraethoxysilane vapor (80° C.) at 170 cc/min, CO$_2$ at 600 cc/min, and N$_2$ gas as a carrier gas at 1500 cc/min. The surface of a wafer was irradiated from outside the reaction chamber by an Hg lamp (wavelengths 184.9 and 254.0 nm) to allow reaction to proceed at 400° C. The reaction resulted in a formation of SiO$_2$ film at a rate of 600 Å/min.

No particle generation was observed and the step coverage was found to be good. An additional use of a mask was found capable of similar selective growth of films on the wafer.

EXAMPLE 5

Into a reaction chamber were introduced tetraethoxysilane vapor (80° C.) at 170 cc/min, NH$_3$ at 500 cc/min, and N$_2$ gas as a carrier gas at 1500 cc/min. The surface of a wafer was irradiated from outside the reaction chamber by an Hg lamp (wavelengths 184.9 and 254.9 nm) to allow reaction to proceed at 400° C. The reaction resulted in a formation of SiO$_2$ film at a rate of 500 Å/min.

No particle generation was observed and the step coverage was found to be good. An additional use of a mask was found capable of similar selective growth of films on the wafer.

EXAMPLE 6

Into a reaction chamber were introduced tetraethoxysilane vapor (80° C.) at 170 cc/min, NH$_3$ at 500 cc/min, and N$_2$ gas as a carrier gas at 1500 cc/min. The surface of a wafer was irradiated from outside the reaction chamber by an Hg lamp (wavelengths 184.9 and 254.0 nm) to allow reaction to proceed at 400° C. The reaction resulted in a formation of Si$_3$N$_4$ at a rate of 500 Å/min.

No particle generation was observed and the step coverage was found to be good. An additional use of a mask was found capable of similar selective growth of films on the wafer.

EXAMPLE 7

Into a reaction chamber were introduced tetraethoxysilane vapor (80° C.) at 170 cc/min, NH$_3$ at 60 cc/min, and N$_2$ gas as a carrier gas at 1500 cc/min. The surface of a wafer was irradiated from outside the reaction chamber by an Hg lamp (wavelengths 184.9 and 254.0 nm) to allow reaction to proceed at 400° C. The reaction resulted in a formation of Si$_x$O$_y$N$_z$ film at a rate of 700 Å/min.

No particle generation was observed and the step coverage was found to be good. An additional use of a mask was found capable of similar selective growth of films on the wafer.

EXAMPLE 8

Into a reaction chamber were introduced tetraethoxysilane vapor (80° C.) at 170 cc/min, N$_2$O at 700 cc/min, PH$_3$ in 1% concentration at 20 cc/min, and N$_2$ gas as a carrier gas at 1500 cc/min. The surface of a wafer was irradiated from outside the reaction chamber by an Hg lamp (wavelengths 184.9 and 254.0 nm) to allow reaction to proceed at 400° C. The reaction resulted in a formation of PSG film at a rate of 750 Å/min.

No particle generation was observed and the step coverage was found to be good. An additional use of a mask was found capable of similar selective growth of films on the wafer.

EXAMPLE 9

Into a reaction chamber were introduced tetreethoxysilane vapor (80° C.) at 170 cc/min, NO at 600 cc/min, and $N_2$ gas as a carrier at 1500 cc/min. The surface of a wafer was irradiated from outside the reaction chamber by an Hg lamp (wavelengths 184.9 and 254.0 nm) to allow reaction to proceed at 400° C. The reaction resulted in a formation of $SiO_2$ film at a rate of 800 Å/min.

No particle generation was observed and the step coverage was found to be good. An additional use of a mask was found capable of similar selective growth of films on the wafer.

EXAMPLE 10

Into a reaction chamber were introduced $SiH_4$ vapor (25° C.) at 35 cc/min, $N_2O$ at 700 cc/min, and $N_2$ gas as a carrier gas at 2600 cc/min. The surface of a wafer was irradiated from outside the reaction chamber by an Hg lamp wavelengths 184.9 and 254.0 nm) to allow reaction to proceed at 400° C. The reaction resulted in a formation of $SiO_2$ film at a rate of 700 Å/min.

No particle generation was observed and the step coverage was found to be good. An additional use of a mask was found capable of similar selective growth of films on the wafer.

EXAMPLE 11

Into a reaction chamber were introduced $SiH_4$ vapor (25° C.) at 30 cc/min, NO at 700 cc/min, and $N_2$ gas as a carrier gas at 2500 cc/min. The surface of a wafer was irradiated from outside the reaction chamber by an Hg lamp (wavelengths 184.9 and 254.0 nm) to allow reaction to proceed at 400° C. The reaction resulted in a formation of $SiO_2$ film at a rate of 800 Å/min.

No particle generation was observed and the step coverage was found to be good. An additional use of a mask was found capable of similar selective growth of films on the wafer.

EXAMPLE 12

Into a reaction chamber were introduced $SiH_4$ vapor (25° C.) at 400 cc/min, $NO_2$ at 600 cc/min, and $N_2$ gas as a carrier gas at 2500 cc/min. The surface of a wafer was irradiated from outside the reaction chamber by an Hg lamp (wavelengths 184.9 and 254.0 nm) to allow reaction to proceed at 400° C. The reaction resulted in a formation of $SiO_2$ film at a rate of 1200 Å/min.

No particle generation was observed and the step coverage was found to be good. An additional use of a mask was found capable of similar selective growth of films on the wafer.

EXAMPLE 13

Into a reaction chamber were introduced $SiH_4$ vapor (25° C.) at 30 cc/min, $NH_3$ at 450 cc/min, and $N_2$ gas as a carrier gas at 2000 cc/min. The surface of a wafer was irradiated from outside the reaction chamber by an Hg lamp (wavelengths 184.9 and 254.0 nm) to allow reaction to proceed at 400° C. The reaction resulted in a formation of $Si_3N_4$ film at a rate of 500 Å/min.

No particle generation was observed and the step coverage was found to be good. An additional use of a mask was found capable of similar selective growth of films on the wafer.

EXAMPLE 14

Into a reaction chamber were introduced $SiH_4$ vapor (25° C.) at 25 cc/min, $N_2O$ at 20 cc/min, $NH_3$ at 400 cc/min, and $N_2$ gas as a carrier gas at 2000 cc/min. The surface of a wafer was irradiated from outside the reaction chamber by an Hg lamp (wavelengths 184.9 and 254.0 nm) to allow reaction to proceed at 400° C. The reaction resulted in a formation of $Si_xO_yN_z$ film at a rate of 1500 Å/min.

No particle generation was observed and the step coverage was found to be good. An additional use of a mask was found capable of similar selective growth of films on the wafer.

EXAMPLE 15

Into a reaction chamber were introduced $SiH_4$ vapor (25° C.) at 35 cc/min, $N_2O$ at 700 cc/min, $PH_3$ in 1% concentration at 20 cc/min, and $N_2$ gas as a carrier gas at 2000 cc/min. The surface of a wafer was irradiated from outside the reaction chamber by an Hg lamp (wavelengths 184.9 and 254.0 nm) to allow reaction to proceed at 400° C. The reaction resulted in a formation of PSG film at a rate of 650 Å/min.

No particle generation was observed and the step coverage was found to be good. An additional use of a mask was found capable of similar selective growth of films on the wafer.

EXAMPLE 16

Into a reaction chamber were introduced $SiH_4$ vapor (25° C.) at 35 cc/min, $CO_2$ at 900 cc/min, and $N_2$ gas as a carrier gas at 2000 cc/min. The surface of a wafer was irradiated from outside the reaction chamber by an Hg lamp (wavelengths 184.9 and 254.0 nm) to allow reaction to proceed at 400° C. The reaction resulted in a formation of $SiO_2$ film at a rate of 700 Å/min.

No particle generation was observed and the step coverage was found to be good. An additional use of a mask was found capable of similar selective growth of films on the wafer.

We claim:

1. A gas-phase growth process for forming a film of $SiO_2$, $Si_3N_4$ or $Si_xO_yN_z$, which comprises introducing a reaction mixture of an organic silane with a reaction gas selected from $O_2$, $N_2O$, $NO_2$, NO, $CO_2$, CO, $NH_3$ or a mixture thereof, into a reaction chamber kept at a reaction temperature below 500° C. and subjecting the surface of a substrate which is contained in said reaction chamber to UV irradiation to effect photo-excitation of said reaction mixture and to induce a surface reaction thereof, forming a film of $SiO_2$, $Si_3N_4$ or $Si_xO_yN_z$.

2. A gas-phase growth process for forming a film of $SiO_2$, $Si_3N_4$ or $Si_xO_yN_z$ according to the pattern of a mask, which comprises introducing a reaction mixture of an organic silane with a reaction gas selected from $O_2$, $N_2O$, $NO_2$, NO, $CO_2$, CO, $NH_3$ or a mixture thereof, into a reaction chamber kept at a reaction temperature below 500° C. and subjecting the surface of a substrate through a mask with a prescribed pattern, said mask being placed over said substrate, to UV irradiation to effect photo-excitation of said reaction mixture and to induce a surface reaction thereof, forming a film of $SiO_2$, $Si_3N_4$ or $Si_xO_yN_z$ according to the pattern of said mask.

3. The gas-phase growth process according to claim 1, wherein the organic silane is a liquid at ordinary temperatures.

4. The gas-phase growth process according to claim 2, wherein the organic silane is a liquid at ordinary temperatures.

5. The gas-phase growth process according to claim 1, wherein the organic silane tetraethoxysilane.

6. The gas-phase growth process according to claim 2, wherein the organic silane is tetraethoxysilane.

* * * * *